United States Patent [19]

Itoh et al.

[11] Patent Number: 4,590,145
[45] Date of Patent: May 20, 1986

[54] PHOTOPOLYMERIZATION INITIATOR COMPRISED OF THIOXANTHONES AND OXIME ESTERS

[75] Inventors: Masanori Itoh; Fumio Takenaka; Kouzi Tohya, all of Himeji, Japan

[73] Assignee: Daicel Chemical Industries, Ltd., Sakai, Japan

[21] Appl. No.: 750,703

[22] Filed: Jun. 28, 1985

[51] Int. Cl.$^4$ ............................................. G03C 1/68
[52] U.S. Cl. ................................... 430/281; 502/167; 502/168; 502/522; 430/919; 430/922; 522/26; 522/113
[58] Field of Search ................... 430/919, 922, 281; 204/159.24; 502/167, 168, 522

[56] References Cited

U.S. PATENT DOCUMENTS

| | | | |
|---|---|---|---|
| 3,558,309 | 1/1971 | Laridon et al. | 430/281 |
| 3,827,957 | 8/1974 | McGinniss | 204/159.24 |
| 3,857,769 | 12/1974 | McGinniss | 204/159.24 |
| 3,876,519 | 4/1975 | McGinniss | 204/159.24 |
| 3,926,643 | 12/1975 | Chang | 204/159.24 X |
| 4,417,023 | 11/1983 | Sinka et al. | 204/159.23 |

OTHER PUBLICATIONS

Leslie Gatechair and Don Wostratzky, "Photoinitiators: An Overview of Mechanisms and Applications", *Journal of Radiation Curing*, Jul. 1983, pp. 4–18.

*Primary Examiner*—John E. Kittle
*Assistant Examiner*—Cynthia Hamilton
*Attorney, Agent, or Firm*—Flynn, Thiel, Boutell & Tanis

[57] ABSTRACT

The initiator composition is effectively used for a photopolymerizable resin composition which comprises a photopolymerizable compound having a double bond for polymerization and a polymer binder and comprises (A) thioxanthone or a substituted thioxanthone and (B) an oxime ester of the formula:

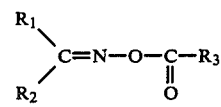

wherein $R_1$ and $R_2$ may be the same or different and represent each an alkyl group having 1 to 10 carbon atoms, a substituted or unsubstituted phenyl, naphthyl, anthryl, pyridyl or quinolyl group or $R_1$ and $R_2$ may be bonded together to form a ring, and $R_3$ represents an alkyl group having 1 to 5 carbon atoms or a substituted or unsubstituted aryl group.

3 Claims, No Drawings

PHOTOPOLYMERIZATION INITIATOR COMPRISED OF THIOXANTHONES AND OXIME ESTERS

BACKGROUND OF THE INVENTION

1. Field of the Invention

The present invention relates to a photopolymerization initiator. More particularly, the invention relates to a photopolymerization initiator to be used for a photopolymerizable resin composition which is cured by photopolymerization in only a part exposed to an activating ray and which has an excellent adhesion to a base material.

2. Prior Art

Photopolymerizable resin compositions have been used as starting materials for inks of activating ray curing type, paints and photoresists. They have a serious defect that the curability of coating films of them are poor upon exposure to the light. Namely, the thickness of the coating film exerts a great influence on the curability. For example, the coating film of photoresist or screen printing ink is as thick as 10 to 100 μm and, therefore, the inner surface of the coating film is not cured sufficiently. This phenomenon is remarkable when a pigment or a dye is incorporated in the photopolymerizable resin composition and a tack remains on the coating film surface. Thus, the expected curability cannot be obtained.

Processes have been proposed for solving the problem of curability by using a combination of photopolymerization initiators such as a combination of benzophenone or its derivative with 4,4'-bis(diethylamino)-benzophenone (Japanese Patent Publication Nos. 37902/1978 and 25943/1979) and a combination of xanthone with a 4,4'-bis(dialkylamino)benzophenone (Japanese Patent Laid-Open No. 92246/1977).

Though these photopolymerization initiators are effective, their effects are yet insufficient particularly when a dye or a pigment is used, since with a coating film thickness of more than 10 μm, the curability becomes insufficient and the adhesion with a base material is reduced.

SUMMARY OF THE INVENTION

After inventive investigations made for the purpose of solving the above-mentioned problems, the inventors have found that a photopolymerizable composition having a quite excellent coating film curability and excellent adhesion to a base material can be obtained when a mixture of thioxanthone or its derivative with an oxime ester is used as the photopolymerization initiator. The present invention has been completed on the basis of this finding.

The invention provides use of two compounds in combination as an initiator for photopolymerization. An initiator composition of the invention comprises thioxanthone having the below shown formula or a thioxanthone derivative having a substituent on the aromatic ring and an oxime ester having a specific formula (II).

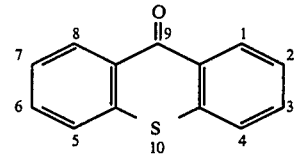

According to the invention, the initiator composition is used for a photopolymerizable resin composition which comprises 5 to 80 percent by weight of a photopolymerizable compound having a double bond for polymerization and the balance of a polymer binder.

In particular, the invention relates to an initiator or sensitizer for photopolymerization which comprises:

(A) thioxanthone or its derivative of the general formula:

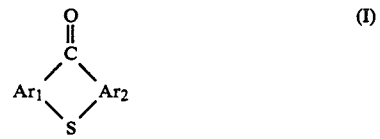

wherein $Ar_1$ and $Ar_2$ represent each a substituted or unsubstituted aromatic nucleus, and (B) an oxime ester of the general formula:

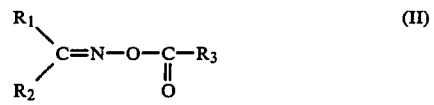

wherein $R_1$ and $R_2$ may be the same or different and represent each an alkyl group having 1 to 10 carbon atoms, a substituted or unsubstituted phenyl, naphthyl, anthryl, pyridyl or quinolyl group or $R_1$ and $R_2$ may be bonded together to form a ring, and $R_3$ represents an alkyl group having 1 to 5 carbon atoms or a substituted or unsubstituted aryl group.

The photopolymerization initiator of the present invention composes a photopolymerizable resin composition together with a photopolymerizable compound, a high molecular binder and other additives, as will be described in detail hereinbelow.

The photopolymerization initiator of the present invention is suitable for use with a photopolymerizable compound having at least one polymerizable double bond in the molecule. Typical examples of these compounds include styrene compounds such as styrene per se, α-methylstyrene and chlorostyrene; monofunctional (meth)acrylates such as methyl (meth)acrylate, ethyl (meth)acrylate, n- and i-propyl (meth)acrylates, n-, sec- and t-butyl (meth)acrylates, tetrahydrofurfuryl (meth)acrylate, 2-ethylhexyl (meth)acrylate, 2-ethylhexyl (meth)acrylate, lauryl (meth)acrylate, stearyl (meth)acrylate, butoxyethyl (meth)acrylate, cyclohexyl (meth)acrylate, phenoxyethyl (meth)acrylate, methoxyethyl (meth)acrylate, ethoxyethyl (meth)acrylate, polyethylene glycol (meth)acrylate, and polypropylene glycol (meth)acrylate; bifunctional (meth)acrylates such as ethylene glycol di(meth)acrylate, diethylene glycol di(meth)acrylate, triethylene glycol di(meth)acrylate, propylene glycol di(meth)acrylate, dipropylene glycol di(meth)acrylate, polyethylene glycol di(meth)acrylate, polypropylene glycol di(meth)acrylate, 1,4-butanediol di(meth)acrylate, neopentyl glycol di(meth)acrylate and 1,6-hexandiol di(meth)acrylate; and trifunctional or higher functional (meth)acrylates such as trimethylolpropane tri(meth)acrylate, trimethylolethane tri(meth)acrylate and pentaerythritol tetra(meth)acrylate. These polymerizable compounds may be used either alone or in the form of a combination of them. They are used in an amount of 5 to 80 wt.%, preferably 10 to 50 wt.%, based on the photopolymerizable resin composition.

The high molecular binders include polystyrene, polymethyl methacrylate, methyl methacrylate/ethyl acrylate copolymer, poly(meth)acrylic acid, styrene/(meth)acrylic acid copolymer, (meth)acrylic acid/methyl methacrylate copolymer, polyvinyl butyral, cellulose esters, polyacrylamide and saturated polyesters. The binder is selected suitably depending on the purpose.

Thioxanthone and its derivatives according to the present invention are those of the above general formula (I) in which the aromatic nucleus $Ar_1$ and $Ar_2$ are substituted with one or more of the following substituents: hydrogen, halogens such as chlorine or bromine; alkyl groups having 1 to 12 carbon atoms which may be substituted with a hydroxy or chlorine, such as methyl, ethyl, n-propyl, isopropyl, n-butyl, sec-butyl, t-butyl, n-amyl, isoamyl, n-hexyl, 1,1-dimethylbutyl, 1-ethyl-2-methylpropyl, 2-ethylbutyl, 1,3-dimethylbutyl, 4-methylpentyl, n-heptyl, 1-methylhexyl, 1-ethyl-1,2-dimethylpropyl, n-octyl, 2-ethylhexyl, 2,2,4-trimethylpentyl, n-nonyl, 1,3,5-trimethylhexyl, n-dodecyl, chloromethyl, 2-chloroethyl and 2-hydroxyethyl groups; alkoxy groups having 1 to 8 carbon atoms which may be substituted with a hydroxy, chlorine, alkoxy group having 1 to 4 carbon or alkoxy-alkoxy group in which each alkoxy group has 1 to 4 carbon atoms, such as methoxy, ethoxy, n-propoxy, isopropoxy, sec-butoxy, n-butoxy, n-pentyloxy, isopentyloxy, 2-ethylhexyloxy, allyloxy, 2-chloroethoxy, 2-hydroxypropoxy, glycidyloxy, 2-hydroxyethoxy, methoxyethoxy, butoxyethoxy, ethoxyethoxyethoxy and benzyloxy groups; acyloxy groups having 1 to 18 carbon atoms, such as acetyloxy, propionoyloxy, acryloyloxy, methacryloyloxy, butyroyloxy, isobutyroyloxy, nonanoyloxy, crotonoyloxy, decanoyloxy, dodecanoyloxy, stearoyloxy, fumaroyloxy, phthaloyloxy, cinnamoyloxy and benzoyloxy; alkoxycarbonyl groups having 1 to 8 carbon atoms which may be substituted with a hydroxy or chlorine, such as methoxycarbonyl, ethoxycarbonyl, 2-hydroxypropoxycarbonyl, 2-chloroethoxycarbonyl, n-butoxycarbonyl, 2-ethylhexylcarbonyl and octyloxycarbonyl; as well as other substituents such as cyclohexyl, phenyl, phenoxy, vinyloxycarbonyl, allyloxycarbonyl, glycidyloxycarbonyl and benzyloxycarbonyl groups. The aromatic nuclei $Ar_1$ and $Ar_2$ may be substituted with different substituents or each of $Ar_1$ and $Ar_2$ may be substituted with different substituents. The manner of substitution does not limit the present invention.

The oxime esters of the present invention are shown by the above general formula (II) in which $R_1$ and $R_2$ may be the same or different and they are as defined in the following groups (1) to (4):
(1) a straight-chain or branched alkyl group having 1 to 10, preferably 1 to 5 carbon atoms,
(2) a phenyl, naphthyl or anthryl group which may be substituted with a straight-chain or branched alkyl group having 1 to 10, preferably 1 to 5, carbon atoms, an alkoxyl group having 1 to 5 carbon atoms, a halogen or an amino, dimethylamino, diethylamino or mercapto group or the like,
(3) a pyridyl group such as 2-pyridyl group, a quinolyl group such as 6-quinolyl group or pyridyl or quinolyl group substituted with the same substituents as in (2), and
(4) a fluorenyl group formed by bonding $R_1$ and $R_2$ together, which group may be substituted with the same substituents as in (2) etc.,
and $R_3$ is as defined in the following groups (5) and (6):
(5) an alkyl group having 1 to 5 carbon atoms, such as methyl, ethyl, propyl, i-propyl, butyl or t-butyl group, and
(6) an aryl group such as phenyl group which may be unsubstituted or substituted with the same substituents as in (2).

The above-mentioned oxime esters include various keton-O-acyloximes. Examples of them include dimethyl ketone-O-acetyloxime, diethyl ketone-O-acetyloxime, acetophenone-O-acetyloxime, acetophenone-O-benzoyloxime, acetophenone-O-(p-methylbenzoyl)oxime, p-methylacetophenone-O-(p-tolylcarbonyl)oxime, 2-naphthyl methyl ketone-O-acetyloxime, 2-naphthyl phenyl ketone-O-propylcarbonyloxime, 9-anthryl methyl ketone-O-acetyloxime, 2-naphthyl methyl ketone-O-benzoyloxime, benzophenone-O-acetyloxime, benzophenone-O-phenylacetyloxime, benzophenone-O-(p-chlorobenzoyl)oxime, p-dimethylaminoacetophenone-O-acetyloxime, p,p'-bis(dimethylamino)benzophenone-O-acetyloxime, p,p-bis(diethylamino)benzophenone-O-benzoyloxime, fluorenone-O-(p-methylbenzoyl)oxime, fluorenone-O-acetyloxime, 2-pyridyl methyl ketone-O-acetyloxime, di(2-pyridyl)ketone-O-acetyloxime, 6-quinolyl methyl ketone-O-ethylcarbonyloxime and 6-quinolyl phenyl ketone-O-acetyloxime. These oxime esters by no means limit the present invention.

These oxime esters and the above-mentioned thioxanthone and its derivatives may be used either alone or in the form of a mixture of two or more of them.

The photopolymerization initiator of the present invention may be used in combination with a known photosensitizer such as benzoin, benzoin alkyl ether, benzophenone, benzyl-2,4,5-triphenylbiimidazole or a derivative thereof.

The ratio of thioxanthone or its derivative to the oxime ester used in the present invention is selected suitably depending on the varieties of them or the photopolymerizable compound. Usually, the weight ratio of thioxanthone or its derivative to the oxime ester is in the range of 1/100 to 10/1.

The amount of the photopolymerization initiator of the present invention is in the range of 0.01 to 20 wt.%, preferably 1 to 10 wt.%, based on the photopolymerizable composition (solid).

The photopolymerizable resin composition containing the photopolymerization initiator of the present invention is applied to the base material by a known method and then exposed to an activating ray to induce the photopolymerization reaction.

The sources of the activating rays used include far ultraviolet ray sources having an intensive emission at 200 to 300 nm, such as Hg—Xe lamp and low-pressure mercury lamp, excimer laser, Hg lamp, xenone lamp and high-pressure mercury lamp having an emission spectrum at 300 nm or higher, as well as $N_2$ laser, argon laser and He—Ne laser.

The following examples will further illustrate the present invention.

EXAMPLE 1

A photopolymerizable composition was obtained by mixing the following components:

| | |
|---|---|
| trimethylolpropane triacrylate | 5 g |
| 2-chlorothioxanthone | 0.01 g |
| 4-methylbenzophenone oxime acetate | 0.25 g |
| methyl ethyl ketone | 5 g |

5 ml of the composition was placed in a Pyrex glass test tube and exposed to a light of a 2 kW ultra-high pressure mercury lamp at a distance of 50 cm for 1 min. The polymer adhered in the form of a film to the inner wall of the tube in the exposed part. When the polymer was taken out and thrown in acetone, it was not dissolved therein.

EXAMPLE 2

A photopolymerizable composition was obtained by mixing the following components:

| | |
|---|---|
| poly(methyl methacrylate) | 50 g |
| trimethylolpropane triacrylate | 30 g |
| 2-chlorothioxanthone | 0.05 g |
| 4-methylbenzophenone oxime acetate | 1.5 g |
| methyl ethyl ketone | 150 g |

The composition was applied uniformly to a polyethylene glycol terephthalate film base having a thickness of 100μ by means of an applicator and then dried at 75° C. to form a sensitive layer having a thickness of 25μ. This product was exposed to a light of a 2 kW ultra-high pressure mercury lamp at a distance of 50 cm for 30 sec. When the polyethylene glycol terephthalate film was bent at a sharp angle, cracks were formed in the photosensitive layer to indicate that it had been cured sufficiently.

EXAMPLE 3

A photopolymerizable composition was obtained by mixing the following components:

| | |
|---|---|
| poly(methyl methacrylate) | 50 g |
| trimethylolpropane triacrylate | 15 g |
| tetraethylene glycol diacrylate | 10 g |
| benzotriazole | 0.2 g |
| N—methyldiethanolamine | 0.05 g |
| Victoria Blue | 0.04 g |
| 2-chlorothioxanthone | 0.1 g |
| 4-methylbenzophenone oxime acetate | 1.5 g |
| methyl ethyl ketone | 120 g |

The composition was applied uniformly to a polyethylene glycol terephthalate film base having a thickness of 25μ and dried at 75° C. to obtain a photosensitive film having a thickness of 25μ. The photosensitive layer was applied to a copper plate having the surface previously washed with acetone by means of a rubber roll heated to 100° C. to form a laminate. Then, a stuffer step tablet was placed thereon and exposed to a light of an ultra-high pressure mercury lamp (2 kW) at a distance of 50 cm for 10 sec. A non-exposed part was washed away with chlorothene to effect the development. A high-quality image was obtained until the seventh step.

EXAMPLE 4

A photopolymerizable composition was obtained by mixing the following components:

| | |
|---|---|
| poly(methyl methacrylate/butyl acrylate/methacrylic acid) (61/17/22 wt. %) | 50 g |
| trimethylolpropane triacrylate | 30 g |
| benzotriazole | 0.2 g |
| N—methyldiethanolamine | 0.05 g |
| Victoria Blue | 0.04 g |
| 2-chlorothioxanthone | 0.1 g |
| 4-methylbenzophenone oxime acetate | 1.5 g |
| methyl ethyl ketone | 45 g |
| dioxane | 60 g |

The composition was applied to the film base and dried in the same manner as in Example 3 to obtain a sensitive layer having a thickness of 25μ. After the exposure in the same manner as above followed by the development with a 1% aqueous sodium carbonate solution at 40° C., a high-quality image was obtained until the sixth step.

EXAMPLE 5

A photopolymerizable composition was obtained by mixing the following components:

| | |
|---|---|
| poly(methyl methacrylate) | 50 g |
| trimethylolpropane triacrylate | 15 g |
| tetraethylene glycol diacrylate | 10 g |
| 2-phenylamino-4,6-dithiol-s-triazine | 0.2 g |
| N—methyldiethanolamine | 0.05 g |
| Victoria Blue | 0.04 g |
| 2-chlorothioxanthone | 0.1 g |
| 4-methylbenzophenone oxime acetate | 1.5 g |
| o-toluenesulfonamide | 2.4 g |
| p-toluenesulfonamide | 3.6 g |
| methyl ethyl ketone | 120 g |

A high-quality image was obtained until the fifth step in the same manner as in Example 3.

EXAMPLE 6

A photopolymerizable composition was obtained by mixing the following components:

| | |
|---|---|
| poly(methyl methacrylate) | 50 g |
| trimethylolpropane triacrylate | 16 g |
| tetraethylene glycol diacrylate | 13 g |
| 2-phenylamino-4,6-dithiol-s-triazine | 0.2 g |
| N—methyldiethanolamine | 0.05 g |
| Victoria Blue | 0.04 g |
| 2,2'-di(o-chlorophenyl)-4,4',5,5'-tetraphenylbisimidazole | 1.5 g |
| Leucocrystal Violet | 0.15 g |
| 2-chlorothioxanthone | 0.1 g |
| 4-methylbenzophenone oxime acetate | 1.5 g |
| o-toluenesulfonamide | 2.4 g |
| p-toluenesulfonamide | 3.6 g |
| methyl ethyl ketone | 120 g |

A high-quality image was obtained until the 8th step in the same manner as in Example 3.

EXAMPLE 7

A photopolymerizable composition was obtained by mixing the following components:

| | |
|---|---|
| poly(methyl methacrylate) | 50 g |

| | |
|---|---|
| trimethylolpropane triacrylate | 16 g |
| tetraethylene glycol diacrylate | 13 g |
| N—methyldiethanolamine | 0.05 g |
| Victoria Blue | 0.04 g |
| thioxanthone | 0.5 g |
| 4-methylbenzophenone oxime acetate | 1.5 g |
| o-toluenesulfonamide | 2.4 g |
| p-toluenesulfonamide | 3.6 g |
| benzotriazole | 0.2 g |
| methyl ethyl ketone | 120 g |

A high-quality image was obtained until the 8th step in the same manner as in Example 3.

EXAMPLE 8

A photopolymerizable composition was obtained by mixing the following components:

| | |
|---|---|
| poly(methyl methacrylate) | 50 g |
| trimethylolpropane triacrylate | 16 g |
| tetraethylene glycol diacrylate | 13 g |
| N—methyldiethanolamine | 0.05 g |
| Victoria Blue | 0.04 g |
| 2,4-dimethylthioxanthone | 0.5 g |
| 4-methylbenzophenone oxime acetate | 1.5 g |
| o-toluenesulfonamide | 2.4 g |
| p-toluenesulfonamide | 3.6 g |
| benzotriazole | 0.2 g |
| methyl ethyl ketone | 120 g |

A high-quality image was obtained until the 7th step in the same manner as in Example 3.

EXAMPLE 9

A photopolymerizable composition was obtained by mixing the following components:

| | |
|---|---|
| poly(methyl methacrylate) | 50 g |
| trimethylolpropane triacrylate | 16 g |
| tetraethylene glycol diacrylate | 13 g |
| N—methyldiethanolamine | 0.05 g |
| Victoria Blue | 0.04 g |
| 2,4-diethylthioxanthone | 0.5 g |
| 4-methylbenzophenone oxime acetate | 1.5 g |
| o-toluenesulfonamide | 2.4 g |
| p-toluenesulfonamide | 3.6 g |
| benzotriazole | 0.2 g |
| methyl ethyl ketone | 120 g |

A high-quality image was obtained until the 8th step in the same manner as in Example 3.

COMPARATIVE EXAMPLE 1

The following components were mixed together:

| | |
|---|---|
| poly(methyl methacrylate) | 50 g |
| trimethylolpropane triacrylate | 15 g |
| tetraethylene glycol diacrylate | 10 g |
| benzotriazole | 0.2 g |
| N—methyldiethanolamine | 0.05 g |
| Victoria Blue | 0.04 g |
| 2-chlorothioxanthone | 0.1 g |
| methyl ethyl ketone | 120 g |

After the application, drying and exposure conducted in the same manner as in Example 3, no image could be obtained at all.

COMPARATIVE EXAMPLE 2

The following components were mixed together:

| | |
|---|---|
| poly(methyl methacrylate) | 50 g |
| trimethylolpropane triacrylate | 15 g |
| tetraethylene glycol diacrylate | 10 g |
| benzotriazole | 0.2 g |
| N—methyldiethanolamine | 0.05 g |
| Victoria Blue | 0.04 g |
| 4-methylbenzophenone oxime acetate | 1.5 g |
| methyl ethyl ketone | 120 g |

After the application, drying and exposure to a light of an ultra-high pressure mercury lamp conducted in the same manner as in Example 3, no image could be obtained at all.

The embodiments of the invention in which an exclusive property or privilege is claimed are defined as follows:

1. An initiator composition for photopolymerization which comprises:

(A) thioxanthone or a derivative thereof of the formula:

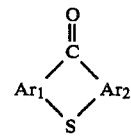

in which $Ar_1$ and $Ar_2$ each are an aromatic ring or a substituted aromatic ring, and (B) an oxime ester of the formula:

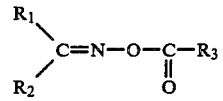

wherein $R_1$ and $R_2$ may be the same or different and represent each an alkyl group having 1 to 10 carbon atoms, a substituted or unsubstituted phenyl, naphthyl, anthryl, pyridyl or quinolyl group or $R_1$ and $R_2$ may be bonded together to form a ring, and $R_3$ represents an alkyl group having 1 to 5 carbon atoms or a substituted or unsubstituted aryl group.

2. An initiator composition as claimed in claim 1, which comprises the compounds (A) and (B) at a weight ratio of 1:100 to 10:1.

3. A photopolymerizable resin composition which comprises 5 to 80 percent by weight of a photopolymerizable compound having a double bond for polymerization, 0.01 to 20 percent by weight of the two initiators (A) and (B) as each defined in claim 1 and the balance is a polymer binder.

* * * * *